United States Patent
Yu et al.

(10) Patent No.: US 10,128,338 B2
(45) Date of Patent: Nov. 13, 2018

(54) SEMICONDUCTORS WITH INCREASED CARRIER CONCENTRATION

(71) Applicants: IMEC VZW, Leuven (BE); Katholieke Universiteit Leuven, KU LEUVEN R&D, Leuven (BE)

(72) Inventors: Hao Yu, Heverlee (BE); Geoffrey Pourtois, Villers-la-Ville (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/787,289

(22) Filed: Oct. 18, 2017

(65) Prior Publication Data
US 2018/0108734 A1    Apr. 19, 2018

(30) Foreign Application Priority Data
Oct. 19, 2016    (EP) .................................... 16194616

(51) Int. Cl.
*H01L 29/08*    (2006.01)
*H01L 29/06*    (2006.01)
(Continued)

(52) U.S. Cl.
CPC .......... *H01L 29/0847* (2013.01); *B82Y 10/00* (2013.01); *H01L 29/0673* (2013.01);
(Continued)

(58) Field of Classification Search
CPC ..... H01L 21/823431; H01L 21/823821; H01L 21/845; H01L 127/0886; H01L 27/0924;
(Continued)

(56) References Cited

U.S. PATENT DOCUMENTS 5,796,127 A * 8/1998 Hayafuji .............. H01L 21/314
257/194
9,152,583 B2   10/2015 Hsieh
(Continued)

FOREIGN PATENT DOCUMENTS

| JP | 2016-54215 A | 4/2016 |
| WO | 2013/019329 A1 | 2/2013 |
| WO | 2015/142357 A1 | 9/2015 |

OTHER PUBLICATIONS

Davies, John H. "The Physics of Low-Dimensional Semiconductors: An Introduction," Cambridge University Press 1998, 451 pages.
(Continued)

*Primary Examiner* — Tucker J Wright
(74) *Attorney, Agent, or Firm* — McDonnell Boehnen Hulbert & Berghoff LLP

(57) ABSTRACT

Within examples, a semiconductor device includes a first structure that includes a first doped semiconductor material of a first doping type. The semiconductor device further includes a metal in contact with the first structure, and a second structure that includes a second doped semiconductor material of the first doping type in contact with the first structure. A band off-set for majority charge carriers between the first doped semiconductor material and the second doped semiconductor material is sufficiently large for charge carriers from the second doped semiconductor material to be transferred into the first doped semiconductor material.

20 Claims, 2 Drawing Sheets

(51) Int. Cl.
*H01L 29/205* (2006.01)
*H01L 29/267* (2006.01)
*H01L 29/36* (2006.01)
*H01L 29/66* (2006.01)
*H01L 29/78* (2006.01)
*H01L 29/786* (2006.01)
*B82Y 10/00* (2011.01)
*H01L 29/417* (2006.01)
*H01L 29/45* (2006.01)
*H01L 29/775* (2006.01)
*H01L 29/423* (2006.01)

(52) U.S. Cl.
CPC ...... *H01L 29/0856* (2013.01); *H01L 29/0873* (2013.01); *H01L 29/205* (2013.01); *H01L 29/267* (2013.01); *H01L 29/36* (2013.01); *H01L 29/41725* (2013.01); *H01L 29/41791* (2013.01); *H01L 29/452* (2013.01); *H01L 29/456* (2013.01); *H01L 29/66431* (2013.01); *H01L 29/66462* (2013.01); *H01L 29/66742* (2013.01); *H01L 29/66795* (2013.01); *H01L 29/775* (2013.01); *H01L 29/78* (2013.01); *H01L 29/785* (2013.01); *H01L 29/7848* (2013.01); *H01L 29/7851* (2013.01); *H01L 29/78618* (2013.01); *H01L 29/78681* (2013.01); *H01L 29/42392* (2013.01)

(58) Field of Classification Search
CPC ....... H01L 27/101826; H01L 27/10879; H01L 27/1211; H01L 29/41791; H01L 29/66795–29/66818; H01L 29/785–29/7856; H01L 2029/7857–2029/7858; H01L 29/0847
See application file for complete search history.

(56) References Cited

U.S. PATENT DOCUMENTS

| | | | |
|---|---|---|---|
| 9,287,360 B1 | 3/2016 | Basu et al. | |
| 2003/0218183 A1* | 11/2003 | Micovic | H01L 21/28575 257/192 |
| 2010/0308340 A1* | 12/2010 | Tilak | H01L 29/1066 257/77 |
| 2012/0292665 A1* | 11/2012 | Marino | H01L 29/1029 257/194 |
| 2013/0264639 A1* | 10/2013 | Glass | H01L 21/28512 257/335 |
| 2014/0001520 A1 | 1/2014 | Glass et al. | |
| 2016/0079372 A1 | 3/2016 | Kittl et al. | |

OTHER PUBLICATIONS

European Search Report, European Patent Application No. 16194616.5, dated May 9, 2017, 9 pages.
Van de Walle et al., "Band Lineups and Deformation Potentials in the Model-Solid Theory", Physical Review B, vol. 39, No. 3, Jan. 15, 1989, pp. 1871-1883.

* cited by examiner

SEMICONDUCTORS WITH INCREASED CARRIER CONCENTRATION

CROSS-REFERENCE TO RELATED APPLICATIONS

The present application is a non-provisional patent application claiming priority to European Patent Application No. 16194616.5, filed on Oct. 19, 2016, the contents of which are hereby incorporated by reference.

FIELD OF THE DISCLOSURE

The present disclosure relates to semiconductor devices and in particular to means for increasing the charge carrier concentration in a semiconductor material in these devices.

BACKGROUND

Metal/semiconductor contact resistance is a component of parasitic resistance in semiconductor devices. A typical method to reduce this contact resistance is by increasing the carrier concentration in the source/drain semiconductors. However, there is a practical upper limit to this carrier concentration when using traditional doping methods. For instance, with n-type group III-V semiconductors, the practical upper limit of carrier concentration is usually below $1 \times 10^{20}$ cm$^{-3}$ using either in situ doping or ion implantation. Such a carrier concentration is typically insufficient to achieve a low contact resistance with the metal.

A different approach is for example described in U.S. Pat. No. 9,152,583, wherein parasitic contact resistance is reduced by providing an intermediate III-V semiconductor material layer between the source/drain regions and their respective contact metals. This approach does however not increase the carrier concentration.

There is thus still a need within the art for means to increase the carrier concentration in semiconductors and thereby reducing the contact resistance.

SUMMARY

It is an object of the present disclosure to provide devices and methods for increasing the carrier concentration in semiconductors.

It is a potential advantage of embodiments of the present disclosure that the contact resistance between a metal and the semiconductor can be lowered.

It is a potential advantage of embodiments of the present disclosure that it is compatible with traditional doping methods.

It is a potential advantage of embodiments of the present disclosure that the practical carrier concentration limits inherent to traditional doping methods can be surpassed.

The above objective is accomplished by a method and device according to the present disclosure.

In a first aspect, the present disclosure relates to a semiconductor device comprising: a first structure comprising a first doped semiconductor material of a first doping type, a metal in contact with the first structure, and a second structure comprising a second doped semiconductor material of the first doping type in contact with the first structure, wherein a band off-set for majority charge carriers between the first doped semiconductor material and the second doped semiconductor material is sufficiently large for charge carriers from the second doped semiconductor material to be transferred into the first doped semiconductor material.

In a second aspect, the present disclosure relates to a method (e.g., for reducing a contact resistance between a metal and a first structure made of a first doped semiconductor material of a first doping type. The method includes: providing a first structure comprising a first doped semiconductor material of a first doping type, providing a metal in contact with the first structure, and providing a second structure comprising a second doped semiconductor material of the first doping type and in contact with the first structure; wherein a band off-set for majority charge carriers between the first doped semiconductor material and the second doped semiconductor material is sufficiently large for charge carriers from the second doped semiconductor material to be transferred into the first doped semiconductor material.

In a third aspect, the present disclosure relates to a use of a second structure, made of a second doped semiconductor material of a first doping type having a band off-set for majority charge carriers between a first structure made of a first doped semiconductor material of the first doping type and the second structure sufficiently large for charge carriers from the second semiconductor material to be transferred into the first semiconductor material, to reduce a contact resistance between a metal and the first structure.

Particular aspects of the disclosure are set out in the accompanying independent and dependent claims. Features from the dependent claims may be combined with features of the independent claims and with features of other dependent claims as appropriate and not merely as explicitly set out in the claims.

The present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the claims. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

Figure 1A:
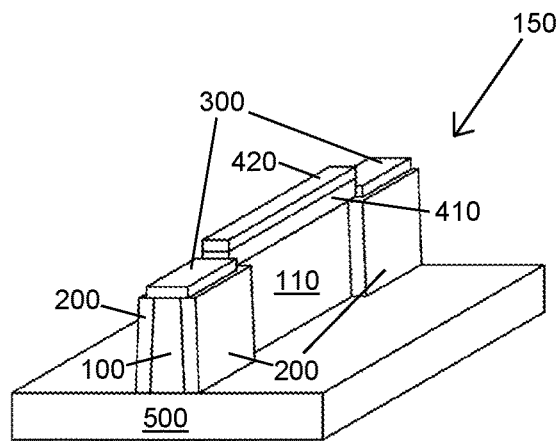
FIG. 1a is a schematic perspective view of a FinFET, in accordance with an embodiment of the present disclosure.

In the different figures, the same reference signs refer to the same or analogous elements.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn to scale for illustrative purposes. The dimensions and the relative dimensions do not correspond to all embodiments of the disclosure.

Furthermore, the terms first, second, third, and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising," when used in the claims, should not be interpreted as being restricted to the elements listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but perhaps many embodiments. Furthermore, the particular features, structures or characteristics may be combined in any suitable manner, as would be apparent to one of ordinary skill in the art from this disclosure, in one or more embodiments.

Similarly it should be appreciated that in the description of embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the method. Thus, a processor with instructions for carrying out such a method or element of a method forms a means for carrying out the method or element of a method. Furthermore, an element described herein of an apparatus embodiment is an example of a means for carrying out the method performed.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Reference will be made to transistors. Some instances of these devices have a first main electrode such as a drain, a second main electrode such as a source and a control electrode such as a gate for controlling the flow of electrical charge carriers between the first and second main electrodes.

It will be clear to a person skilled in the art that the present disclosure is also applicable to similar devices that can be configured in any transistor technology, including for example, but not limited thereto, CMOS, BiCMOS, Bipolar and SiGe BiCMOS technology. Furthermore, the findings of the present disclosure are explained with reference to PMOS and NMOS transistors as an example, but the present disclosure includes within its scope complementary devices whereby PMOS and NMOS transistors become NMOS and PMOS transistors, respectively. A skilled person can make such modifications without departing from the true technical teachings of the disclosure.

The following term is provided solely to aid in the understanding of the disclosure.

As used herein, the band offset between two materials is the energy gap between the conduction or valence bands of the two materials when these materials are in contact with one another, where the conduction bands are applicable when the majority charge carriers are electrons and the valence bands are applicable when the majority charge carriers are holes.

As used herein, and unless provided otherwise, when a first feature is said to be "in contact" with a second feature, it is meant that the first feature is in physical contact with the second feature, or in other words, it is meant that the first feature is touching the second feature.

In a first aspect, the present disclosure relates to a semiconductor device comprising: a first structure comprising a first doped semiconductor material of a first doping type, a metal in contact with the first structure, and a second structure made of a second doped semiconductor material of the first doping type in contact with the first structure, wherein a band offset for majority charge carriers between the first doped semiconductor material and the second doped semiconductor material is sufficiently large for charge carriers from the second doped semiconductor material to be transferred into the first doped semiconductor material.

It was surprisingly found that a second structure of a doped semiconductor material can be used to transfer additional charge carriers into a first structure of a first doped semiconductor material. Furthermore, using this technique may overcome the practical charge carrier concentration limit inherent to traditional doping methods, such as in situ doping or ion implantation.

In some embodiments, the first structure may comprise at least one zone in contact with the metal, the zone having a charge carrier concentration of at least $1 \times 10^{20}$ cm$^{-3}$, or at least $5 \times 10^{20}$ cm$^{-3}$. For example, for III-V semiconductors, charge concentrations achieved by traditional doping methods are typically below $1 \times 10^{20}$ cm$^{-3}$.

The first structure might not be separated from the metal by the second structure.

In some embodiments, the metal is in direct contact with the first structure.

In some embodiments, the band offset for majority charge carriers is within the ranges of 0.2 to 5.0 eV, 0.3 to 4.0 eV, or 0.5 to 2.0 eV. Such band offset values are typically suitable for charge carriers to be transferred from the second doped semiconductor material to the first doped semiconductor material. The band offset can be evaluated as the energy gap between the conduction or valence bands of the first and second semiconductor as bulk materials on their own. This is one method reflected in the present disclosure. Actual values for the conduction or valence bands energy levels can be taken from the literature and can for example be evaluated by the model solid theory (see E. G. Van de Walle et al., Phys. Rev. B (USA) vol. 39 (1989) p. 1871). For instance, the valence band energy level for Si derived in this reference was −7.03 eV and the valence band energy level for Ge derived in this reference was −6.35 eV, leading to a band offset of 0.68 eV. Other methods include modelling the energy level values based on density functional theory (DFT) or measuring them using electrical measurements (e.g. via cyclovoltametry), X-ray photoelectron spectroscopy (XPS), photoemission spectroscopy or Kelvin probe microscopy. It should be noted that absolute values of the energy levels typically depend on the technique used to obtain them, whereas relative differences are typically technique independent. Hence the band offset values have a low dependence on the technic used to evaluate them.

Effects, such as size quantization effects that may occur when the first and/or second structure have at least one dimension below 15 nm, e.g. below 10 nm, or such as interfacial chemical bonds between the first and the second structure, can alter the position of the respective energy bands as compared to their bulk values. In such cases, the evaluation of the band offset based on the bulk values may be improved by taking these effects into account in the evaluation. Methods available for that purpose are well known to the person skilled in the art and may include computations based on DFT or on (non)-parabolic analytic expressions (see e.g. J. Davies, "The Physics of Low-Dimensional Semiconductors: an introduction", Cambridge University Press, 1998.) For example, for n-MOS III/V materials, quantization effects can be very strong and shifts of the conduction band of 0.5 eV or more can occur. Typically, the changes induced in the energy band position due to quantization effects evolve as a function of thickness/effective mass. For light effective mass semiconductors (e.g. III/V materials), quantization effects of a few meV typically appear from a film thickness of about 14 nm, rising to around 0.1 eV for about 10 nm and further increasing to about 0.5 eV for a thickness of 4 nm. Due to their higher effective mass, the effect is present but less pronounced for Si and Ge.

The first and second semiconductors may be of a same doping type, meaning they may be both either n-doped or p-doped. In some embodiments, both the first and the second semiconductors are doped with the same dopant. Using the same dopant may advantageously allow both semiconductors to be doped in a single doping step.

The second structure, a function of which may be to increase the charge carrier concentration in the first structure by transferring carriers therein, may be present outside of the (main) current path of the semiconductor device. Transferring the charge carriers typically occurs upon contacting the two structures, forming a heterojunction between them, and might not require a current to be running through the semiconductor device. In some embodiments, a current path may be running through the metal and the first structure without running through the second structure. This situation most typically occurs when there is no contact between the metal and the second structure. In other embodiments, an additional current path may be running through the metal and the second structure. This situation most typically occurs when the metal contacts both the first and the second structure. However, since the charge transfer (i.e. heterojunction formation) creates a considerable potential difference between the two structures, the current through the second structure will typically be small compared to the current through the first structure.

The extent to which the second structure can increase the charge carrier concentration in the first structure may depend on both the band offset between the first and the second structure and the amount of charge carriers in the second structure, i.e. on its charge carrier concentration and on its volume. As such, the second structure may be highly doped, i.e. having a high charge carrier concentration (e.g. at least $1 \times 10^{19}$ cm$^{-3}$). Typically, the larger the volume ratio between the second structure and the first structure, the larger the extent to which the second structure can increase the charge carrier concentration in the first structure. The actual effect obtained for a given volume ratio typically depends on the charge carrier concentration of the second structure, and the band offset between the first and the second structure. In an embodiment, this volume ratio may be above 0.5, or above 1.

Furthermore, the final charge carrier concentration in the first structure will also depend on its initial charge carrier concentration, i.e. before charge transfer from the second structure, and it is therefore also beneficial for the first structure to be highly doped (e.g. at least $1 \times 10^{19}$ cm$^{-3}$).

In some embodiments, the first and/or second structures may have at least one dimension ranging from 1 to 100 nm, or from 5 to 20 nm; i.e. the first and/or second structures may be nanostructures. In some embodiments, the first semiconductor material may be p-type Ge and the second semiconductor material may be p-type Si. These particular materials may advantageously yield a first semiconductor with a high concentration of hole charge carriers. In other embodiments, the first semiconductor material may be n-type InGaAs and the second semiconductor material may be n-type InP. These particular materials may advantageously yield a first semiconductor with a high concentration of electron charge carriers.

In some embodiments, the semiconductor device may be a field-effect transistor (FET), the first structure may be a source or a drain and the metal may be a contact to the source or drain. Increasing the charge carrier concentration in the first structure and thereby reducing the contact resistance with the first metal is generally useful in field-effect transistors.

In some embodiments, the semiconductor device may be a Fin Field Effect Transistor (FinFET), wherein the first structure may be comprised in a fin. In some embodiments, the first structure comprised in the fin may be in contact with one or more second structures on two lateral sides of the fin (see e.g. example 1). In other words, the first structure comprised in the fin may have two sidewalls, each in contact with a second structure. For instance, the first sidewall could be in contact with a first second structure and the second sidewall could be in contact with a further second structure; or the first sidewall and the second sidewall could both contact a same second structure.

In other embodiments, the first structure may be comprised in a nanowire. In embodiments, the first structure comprised in the nanowire may be in contact with the second structure on a longitudinal end of the nanowire (see e.g. example 2). In other words, the first structure may comprise an extremity of the nanowire and that extremity may be in contact with the second structure. As a result, the first structure is between the channel and the second structure.

In yet other embodiments, the semiconductor device may be a planar MOSFET.

In a second aspect, the present disclosure relates to a method (e.g., for reducing a contact resistance between a metal and a first structure made of a first doped semiconductor material of a first doping type). The method includes: providing a first structure comprising a first doped semiconductor material of a first doping type, providing a metal in contact with the first structure, and providing a second structure comprising a second doped semiconductor material of the first doping type and in contact with the first structure; wherein a band offset for majority charge carriers between the first doped semiconductor material and the second doped semiconductor material is sufficiently large for charge carriers from the second doped semiconductor material to be transferred into the first semiconductor material.

In embodiments, the charge carrier concentrations of the first doped semiconductor material of the first structure and of the second structure may be each of at least $1 \times 10^{19}$ cm$^{-3}$. It may be advantageous for both semiconductors to be highly doped, in order to achieve a high charge carrier concentration in the first structure after charge transfer.

In embodiments, the different features of the second aspect and its embodiments may independently be as correspondingly described for the first aspect and its embodiments.

In a third aspect, the present disclosure relates to a use of a second structure, made of a second doped semiconductor material of a first doping type having a band offset for majority charge carriers between a first structure made of a first doped semiconductor material of the first doping type and the second structure sufficiently large for charge carriers from the second semiconductor material to be transferred into the first semiconductor material, to reduce a contact resistance between a metal and the first structure.

In embodiments, the different features of the third aspect and its embodiments may be independently as correspondingly described for the first or second aspect and their embodiments.

The disclosure will now be described by a detailed description of several embodiments of the disclosure. It is clear that other embodiments of the disclosure can be configured according to the knowledge of the person skilled in the art without departing from the true technical teaching of the disclosure.

Example 1: FinFET

Figure 1B:
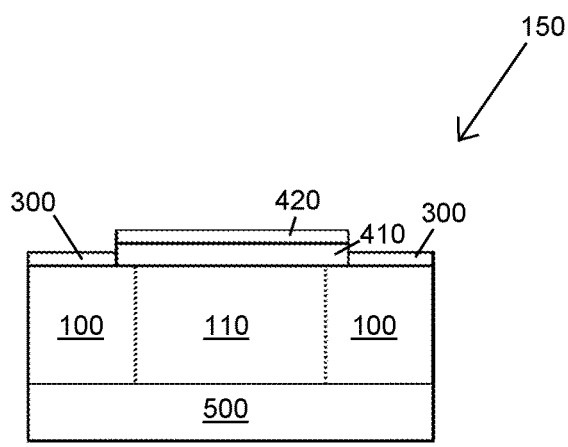
FIG. 1b is a longitudinal cross-section view through the perspective view of FIG. 1a, in accordance with an embodiment of the present disclosure.

FIG. 1a is a perspective schematic view of a FinFET (150), in accordance with an embodiment of the present disclosure. FIG. 1b shows a longitudinal cross section through the FinFET (150). The FinFET (150) includes a semiconductor fin (110), e.g. n-doped InGaAs, on a substrate (500). A gate, comprising a gate dielectric (410) and a gate metal (420) is present on top of a middle portion of the fin (110), defining a channel therein. Metallic contacts (300) connect to the source and drain regions (100) at the longitudinal ends of the fin (110). The first semiconductor in the source and drain regions (100) has its charge carrier concentration increased by being sandwiched between two second semiconductor structures (200), e.g. n-doped InP, which transfer charge carriers therein.

Example 2: Nanowire FET

Figure 2A:
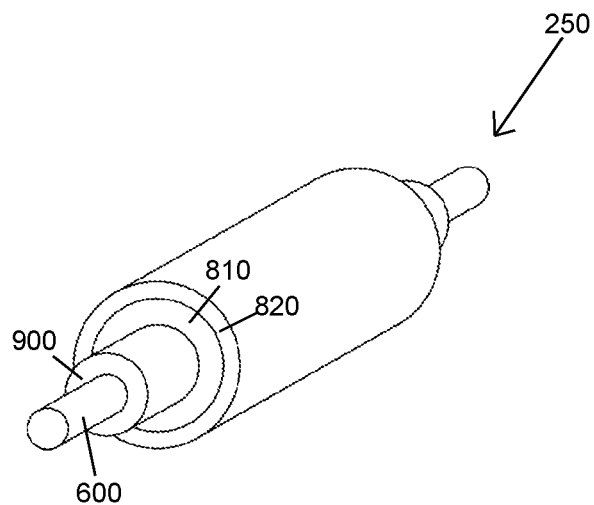
FIG. 2a is a schematic perspective view of a nanowire FET, in accordance with an embodiment of the present disclosure.
Figure 2B:
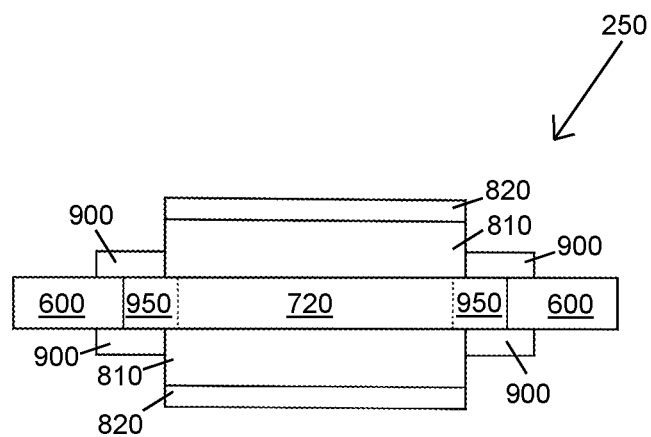
FIG. 2b is a longitudinal cross-section view through the perspective view of FIG. 2a, in accordance with an embodiment of the present disclosure.

FIG. 2a is a perspective schematic view of a nanowire FET (250) in accordance with an embodiment of the present disclosure. FIG. 2b shows a longitudinal cross section through the nanowire FET (250). The nanowire (720) comprises a first semiconductor, e.g. n-doped InGaAs. A gate, comprising a gate dielectric (810) and a gate metal (820) is present around a middle portion of the nanowire (720), defining a channel therein. Metallic contacts (900) connect to the source and drain regions (950) around the longitudinal ends of the nanowire (720). The first semiconductor in the source and drain regions (950) has its charge carrier concentration increased by being in contact at the longitudinal ends with second semiconductor structures (600), e.g. n-doped InP, which transfer charge carriers therein.

It is to be understood that although some embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

While some embodiments have been illustrated and described in detail in the appended drawings and the foregoing description, such illustration and description are to be considered illustrative and not restrictive or limiting. Other variations to the disclosed embodiments can be understood and effected in practicing the claims, from a study of the drawings, the disclosure, and the appended claims. The mere fact that certain measures or features are recited in different dependent claims does not indicate that a combination of these measures or features cannot be used. Any reference signs in the claims should not be construed as limiting the scope.

What is claimed is:
1. A semiconductor device comprising:
    a source and a drain, wherein at least one of the source or the drain comprises a first doped semiconductor material of a first doping type;
    a channel region between the source and the drain;

a gate electrode;
a gate dielectric between the gate electrode and the channel region;
a metal in contact with the at least one of the source or the drain; and
a semiconductor structure comprising a first portion and a second portion, the first portion and the second portion each comprising a second doped semiconductor material of the first doping type, the first portion being in contact with the at least one of the source or the drain on a first side of the at least one of the source or the drain, the second portion being in contact with the at least one of the source or the drain on a second opposing side of the at least one of the source or the drain, wherein as a result of a band offset for majority charge carriers between the first doped semiconductor material and the second doped semiconductor material, charge carriers from the second doped semiconductor material have been transferred into the first doped semiconductor material,
the source and the drain at least partially forming a current path that does not include the semiconductor structure.

2. The semiconductor device according to claim 1, the semiconductor device being a Fin Field Effect Transistor, wherein the at least one of the source or the drain comprises a fin.

3. The semiconductor device according to claim 2, wherein the at least one of the source or the drain has two sidewalls each in contact with the semiconductor structure.

4. The semiconductor device according to claim 1, wherein the at least one of the source or the drain comprises a nanowire.

5. The semiconductor device according to claim 4, wherein the at least one of the source or the drain comprises an extremity of the nanowire and wherein that extremity is in contact with the semiconductor structure.

6. The semiconductor device according to claim 1, wherein the band offset for majority charge carriers is within a range of 0.2 eV to 5.0 eV.

7. The semiconductor device according to claim 1, wherein the at least one of the source or the drain has at least one dimension within at least one of: a range of 1 nm to 100 nm or a range of 5 nm to 20 nm.

8. The semiconductor device according to claim 1, wherein the semiconductor structure has at least one dimension within at least one of: a range of 1 nm to 100 nm or a range of 5 nm to 20 nm.

9. The semiconductor device according to claim 1, wherein the at least one of the source or the drain comprises at least one zone in contact with the metal, the zone having a charge carrier concentration of at least $1 \times 10^{20}$ cm$^{-3}$.

10. The semiconductor device according to claim 1, wherein the first doped semiconductor material is p-type Ge and wherein the second doped semiconductor material is p-type Si.

11. The semiconductor device according to claim 1, wherein the first doped semiconductor material is n-type InGaAs and wherein the second doped semiconductor material is n-type InP.

12. The semiconductor device according to claim 1, wherein the band offset for majority charge carriers is within a range of 0.3 eV to 4.0 eV.

13. The semiconductor device according to claim 1, wherein the band offset for majority charge carriers is within a range of 0.5 eV to 2.0 eV.

14. A method comprising:
providing a source and a drain, wherein at least one of the source or the drain comprises a first doped semiconductor material of a first doping type;
providing a channel region between the source and the drain;
providing a gate electrode;
providing a gate dielectric between the gate electrode and the channel region;
providing a metal in contact with the at least one of the source or the drain; and
providing a semiconductor structure comprising a first portion and a second portion, the first portion and the second portion each comprising a second doped semiconductor material of the first doping type, the first portion being in contact with the at least one of the source or the drain on a first side of the at least one of the source or the drain, the second portion being in contact with the at least one of the source or the drain on a second opposing side of the at least one of the source or the drain,
wherein as a result of a band offset for majority charge carriers between the first doped semiconductor material and the second doped semiconductor material, charge carriers from the second doped semiconductor material have been transferred into the first doped semiconductor material
the source and the drain at least partially forming a current path that does not include the semiconductor structure.

15. The method according to claim 14, wherein charge carrier concentrations of the first doped semiconductor material and of the second doped semiconductor material are each at least $1 \times 10^{19}$ cm$^{-3}$.

16. The method according to claim 14, wherein the source and the drain are part of Fin Field Effect Transistor, wherein the at least one of the source or the drain comprises a fin.

17. The method according to claim 16, wherein the at least one of the source or the drain has two sidewalls each in contact with the semiconductor structure.

18. The method according to claim 16, wherein the at least one of the source or the drain comprises a nanowire.

19. The method according to claim 18, wherein the at least one of the source or the drain comprises an extremity of the nanowire and wherein that extremity is in contact with the semiconductor structure.

20. The method according to claim 14, wherein the band offset for majority charge carriers is within a range of 0.3 eV to 4.0 eV.

* * * * *